(12) United States Patent
Liaw et al.

(10) Patent No.: US 7,286,429 B1
(45) Date of Patent: Oct. 23, 2007

(54) HIGH SPEED SENSING AMPLIFIER FOR AN MRAM CELL

(75) Inventors: Jhon Jhy Liaw, Hsinchu (TW); Denny Tang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 11/379,854

(22) Filed: Apr. 24, 2006

(51) Int. Cl.
*G11C 11/00* (2006.01)

(52) U.S. Cl. .............. 365/209; 365/158; 365/189.07; 365/210

(58) Field of Classification Search ............. 365/209
See application file for complete search history.

(56) References Cited

U.S. PATENT DOCUMENTS

| | | | |
|---|---|---|---|
| 6,469,929 B1 | 10/2002 | Kushnarenko et al. | |
| 6,490,192 B2 | 12/2002 | Thewes et al. | |
| 6,600,690 B1 * | 7/2003 | Nahas et al. | 365/210 |
| 6,665,216 B1 * | 12/2003 | Ho et al. | 365/189.07 |
| 6,845,052 B1 | 1/2005 | Ho et al. | |
| 6,940,744 B2 * | 9/2005 | Rinerson et al. | 365/148 |
| 7,203,112 B2 * | 4/2007 | Liaw | 365/209 |
| 2005/0105375 A1 | 5/2005 | Iwata | |

OTHER PUBLICATIONS

H.S. Jeong, G.T. Jeong, G.H. Koh, et al., Fully Integrated 64Kb MRAM with Novel Reference Cell Scheme, Advanced Technology Development and Process Development Team, Samsung Advanced Institute of Technology, IEEE 2002.

Peter K. Naji, Mark Durlam, Saied Tehrani, John Calder and Mark F. DeHerrera, A 256kb 3.0V 1T1MTJ Nonvolatile Magnetoresistive RAM, International Solid-State Circuits Conference, IEEE 2001.

* cited by examiner

*Primary Examiner*—Tan T. Nguyen
(74) *Attorney, Agent, or Firm*—Baker & McKenzie LLP

(57) ABSTRACT

A method and circuits are disclosed for sensing an output of a memory cell having high and low resistance states. A high reference cell is in high resistance state and a low reference cell is in low resistance state. The resistance of the high reference cell in high resistance state has a first margin of difference from the resistance of the memory cell in high resistance state. The resistance of the low reference cell in low resistance state has a second margin of difference from the resistance of the memory cell in low resistance state. Differential amplifiers coupled to the memory cell and the high and low reference cells provide a digital output representing the resistance state of the memory cell.

20 Claims, 8 Drawing Sheets

300

| TOP ELECTRODE 302 |
| FERROMAGNETIC FREE LAYER 304 |
| SPACER 306 |
| FERROMAGNETIC PINNED LAYER 308 |
| ANTIFERROMAGNETIC PINNING LAYER 310 |
| BOTTOM ELECTRODE 312 |

*FIGURE 3*
*(PRIOR ART)*

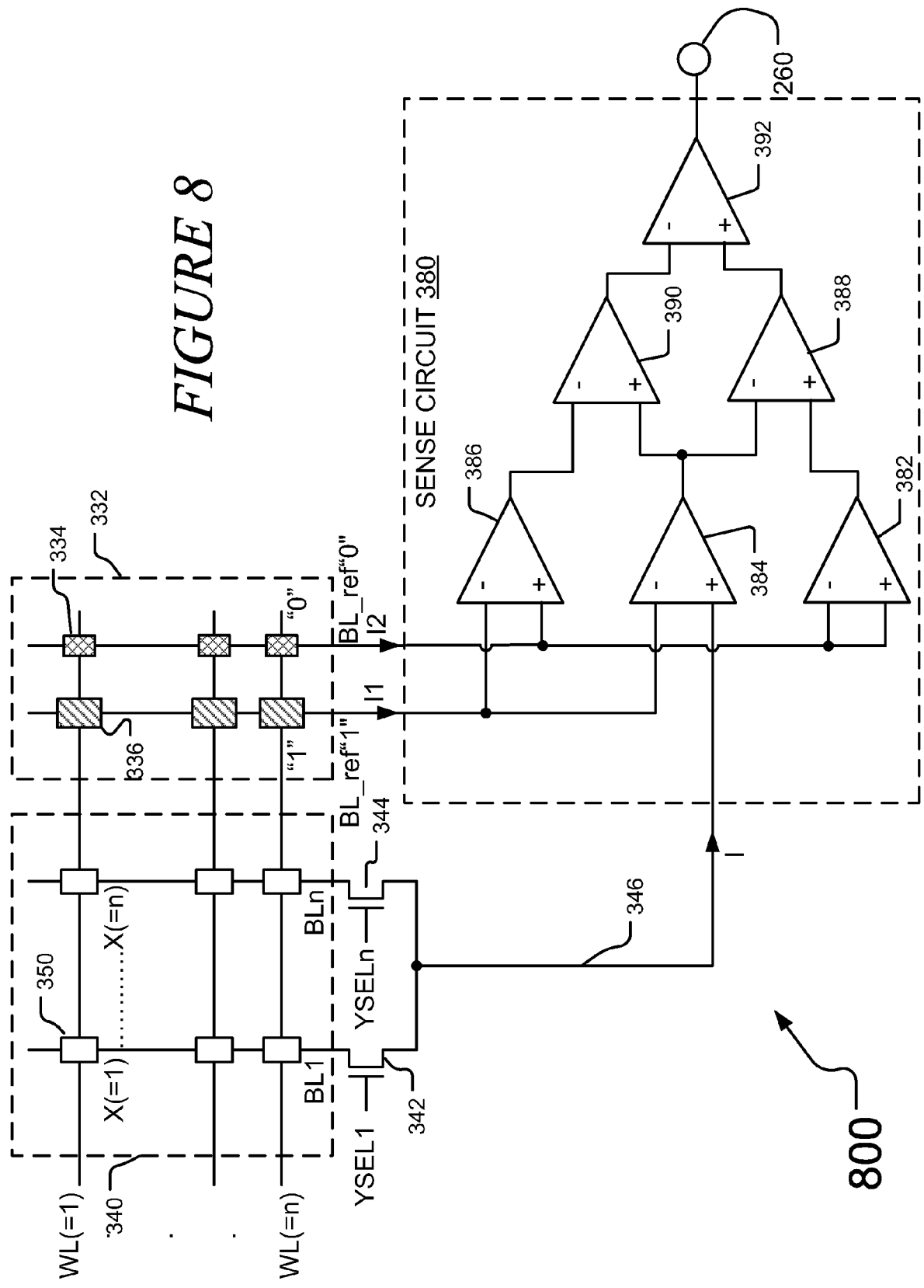

HIGH SPEED SENSING AMPLIFIER FOR AN MRAM CELL

TECHNICAL FIELD

Disclosed embodiments herein relate generally to integrated circuits, and more particularly to methods and systems for improving a sense margin when reading data from memory cells.

BACKGROUND

Magnetic random access memory (MRAM) is a type of non-volatile memory that uses magnetism rather than electrical power to store data. Key attributes of MRAM technology are nonvolatility and unlimited read and program endurance. Conventional MRAM cells are described in U.S. patent application Ser. No. 10/907,977, entitled "Magnetic Random Access Memory Device," by Jhon Jhy Liaw, and is herein incorporated by reference for all purposes. Also pertinent as background to this invention is U.S. patent application Ser. No. 11/150,014, entitled "Multiple Stage Method and System for Sensing Outputs from Memory Cells," filed Jun. 13, 2005, by Jhon Jhy Liaw, and is also herein incorporated by reference for all purposes.

A fundamental issue for MRAM technology is the sensing scheme for reading data from a magnetoresistive element within an MRAM cell. Conventional schemes have several limitations and drawbacks. One such limitation that affects reliability is caused by temperature and process-induced disparities in the Magneto-Resistance (MR) ratio of cells. Since cells may perform differently when a potential is applied to them, and known read schemes have limited sensing margins, there may be errors in detecting the state of the data stored in the magnetoresistive element. For example, a known sense amplifier design is provided by H. S. Jeong et al., in a paper entitled "Fully Integrated 64 Kb MRAM with Novel Reference Cell Scheme," ISBN 0-7803-7463-X (2002). In this conventional sense amplifier design, a reference current $I_{ref}$ is generated by averaging $I_{max}$ cell current and $I_{min}$ cell current (i.e., $I_{ref}=(I_{max}+I_{min})/2$). The read current through a selected cell is compared with the reference current by a current sense amplifier circuit. In Jeong's read scheme, the maximum sensing margin is half of the MR ratio (1/2 MR), with around a ten to twenty percent differential margin. With process and operational fluctuations, such as disparities in magnetoresistance element area, MR ratio, temperature effects, MOSFET characteristics, et cetera, the final sensing margin may be lower than 0% and thereby result in a read fail.

Another limitation is that of speed in reading data. Currently, logic circuits are operating at frequencies in the GHz ranges. However, conventional MRAM read schemes are constrained to operate at much slower rates, causing a significant performance gap between the logic circuits and the MRAM memory. This performance gap results in a suboptimal performance of the logic circuits because supporting MRAM memory devices cannot provide data and instructions fast enough. Thus, this results in a bottleneck effect at the MRAM devices, particularly in System on Chip (SoC) designs, which combine memory with logic circuitry on a chip.

Thus, sensing the resistance state of an MRAM memory cell can be unreliable. It would therefore be desirable to more reliably sense the resistance states of memory cells in MRAM devices, and to improve the speed of MRAM data read access.

BRIEF SUMMARY

Disclosed herein is a sensing circuit and method with an increased sense margin for sensing an output of a memory cell capable of switching between a high resistance state and a low resistance state.

In an embodiment, a high reference cell is in high resistance state and a low reference cell is in a low resistance state. The resistance of the high reference cell in high resistance state has a first margin of difference from the resistance of a memory cell in a high resistance state, and the resistance of the low reference cell in low resistance state has a second margin of difference from the resistance of a memory cell in a low resistance state. A predetermined voltage is applied to the memory cell, the high reference cell, and the low reference cell to generate an output current, a first reference current, and a second reference current, respectively. A set of differential amplifiers is selectively coupled to the memory cell and the high and low reference cells to provide a first difference signal representing the difference between the output current and the first reference current, and a second difference signal representing the difference between the output current and the second reference current. A sense amplifier is coupled to the differential amplifiers for comparing the first difference signal with the second difference signal to generate a digital output representing the resistance state of the memory cell.

Also disclosed herein is a method for sensing a resistance state of a memory cell having a high resistance state or a low resistance state. The method includes receiving an output current reflecting a resistance of the memory cell, receiving a first reference current reflecting the high resistance state in the high reference cell, and receiving a second reference current reflecting the low resistance state in the low reference cell. The resistance of the high reference cell in high resistance state has a first margin of difference from the resistance of the memory cell when in a high resistance state, and the resistance of the low reference cell in low resistance state has a second margin of difference from the resistance memory of the memory cell when in a low resistance state. The method also includes generating a first difference signal representing the difference between the output current and the first reference current, and generating a second difference signal representing the difference between the output current and the second reference current. The method also includes comparing the first difference signal with the second difference signal to generate a digital output representing the resistance state of the memory cell.

BRIEF DESCRIPTION OF THE SEVERAL VIEWS OF THE DRAWINGS

For a more complete understanding of the principles disclosure herein, and the advantages thereof, reference is now made to the following descriptions taken in conjunction with the accompanying drawings, in which:

FIG. 3 shows a schematic block diagram of a typical magnetic tunnelling junction (MTJ) structure in accordance with the present disclosure;

FIG. 8 shows a schematic diagram of yet another embodiment of a sense amplifier circuit with an improved sense margin in accordance with the present disclosure.

DETAILED DESCRIPTION

Figure 1:
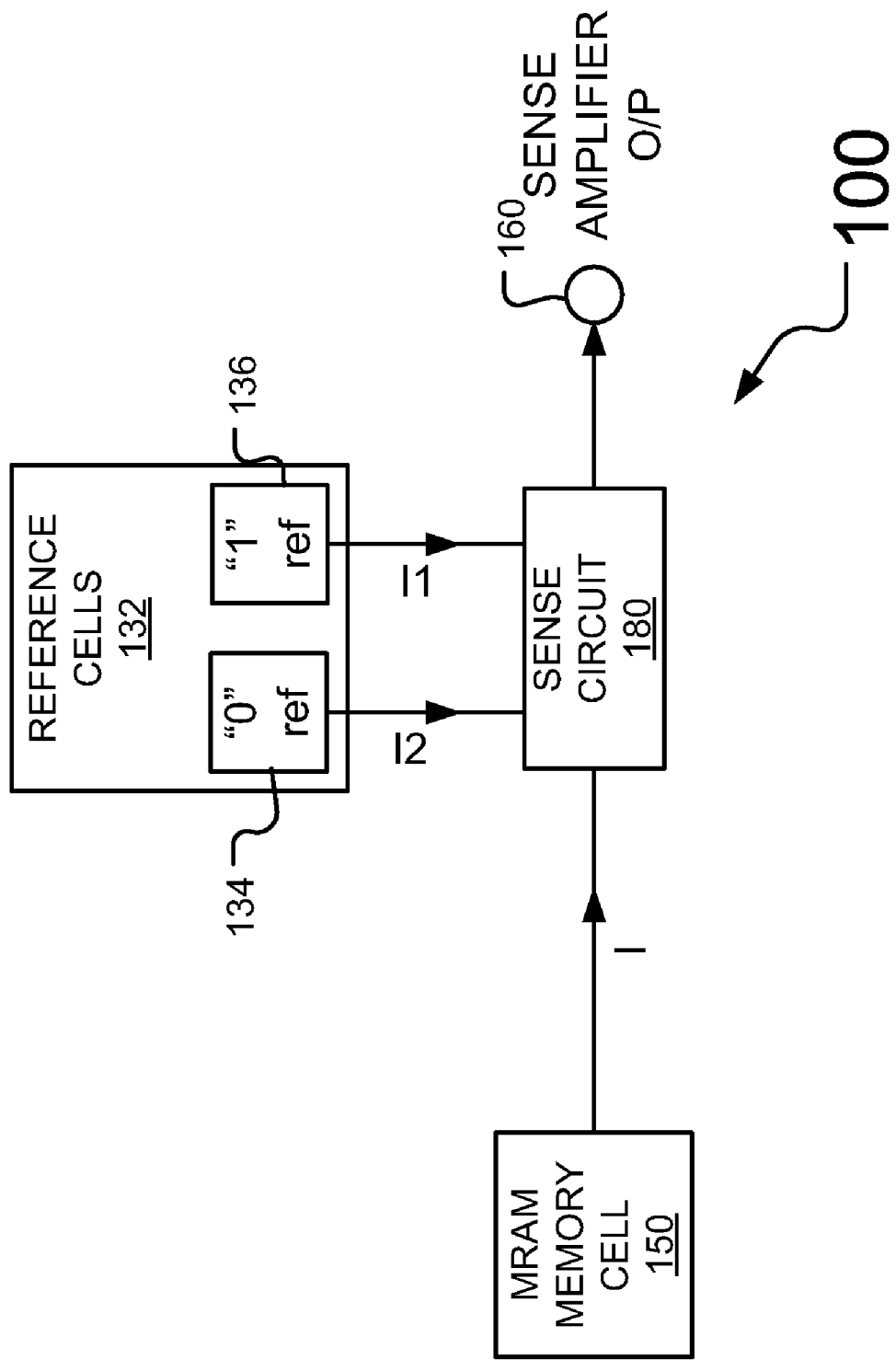
FIG. 1 shows a schematic block diagram of an MRAM memory cell and reference cells coupled to a sense amplifier in accordance with the present disclosure.

FIG. 1 shows a schematic diagram of a portion 100 of an MRAM array, which includes an MRAM memory cell 150, a sense amplifier 180, and reference cells 132, operably coupled as shown. MRAM memory cell 150 has a high resistance state and a low resistance state, depending on whether the cell 150 is configured with a high or low logical state of data. The reference cells 132 include a low ("0") reference cell 134, which is configured with a low resistance state, and a high ("1") reference cell 136, which is configured with a high resistance state. The resistance of the high reference cell 136 in high resistance state has a first margin of difference from the resistance of the MRAM memory cell 150 in high resistance state. The resistance of the low reference cell 134 in low resistance state has a second margin of difference from the resistance of the MRAM memory cell 150 in low resistance state. The margins of difference of the resistance states may be determined by the difference in memory cell area between MRAM memory cell 150 and the reference memory cells 134 and 136.

Generally, the sense amplifier 180 determines the binary logic state of data stored in MRAM memory cell 150 by comparing an output current (I) from the MRAM memory cell 150 with a first reference current (I1) from high reference cell 136 and a second reference current (I2) from low reference cell 134. First reference current (I1) is representative of the resistance of a memory cell storing data with the high resistance state. Likewise, second reference current (I2) is representative of the resistance of a memory cell storing data with the low resistance state. The output current, first, and second reference currents may be generated by applying a predetermined voltage to the memory cells 150 and the reference cells 132. Sense amplifier 180 compares output current with the first and second reference currents to determine the resistance state of the MRAM cell 150, and provides an output signal at the sense amplifier output 160 indicating a logic-low or logic-high state of data stored in the MRAM memory cell 150.

Figure 2:
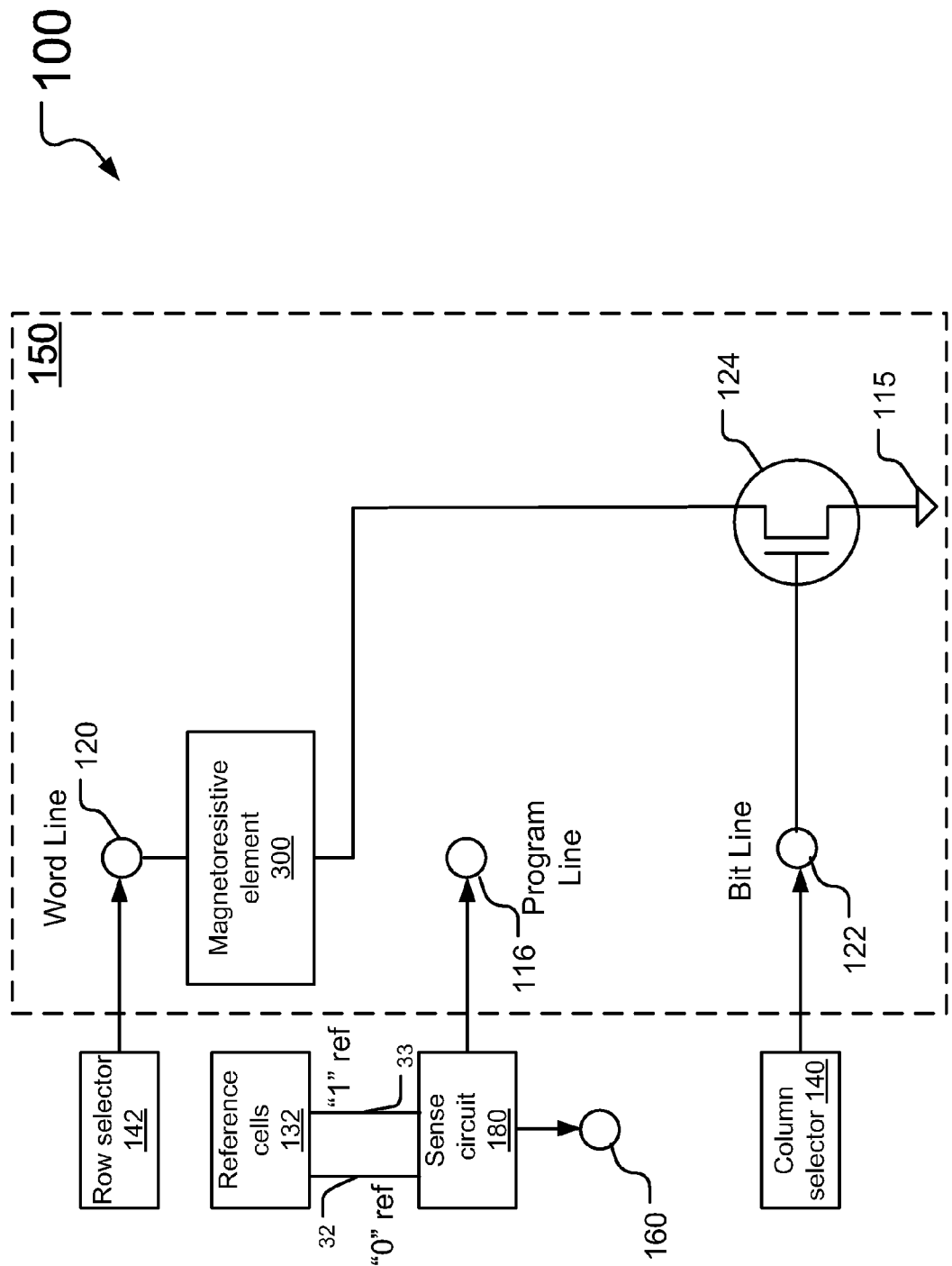
FIG. 2 shows a schematic diagram of an exemplary MRAM memory cell and reference cells coupled to a sense amplifier in accordance with the present disclosure.

FIG. 2 shows a schematic diagram of a portion 100 of an MRAM array, which includes an exemplary MRAM memory cell 150, a sense circuit 180, reference cells 132, column selector 140, and row selector 142, operably coupled as shown in the figure. The memory cell 150 includes a magnetoresistive element 300, and a reference transistor 124. Sense circuit 180 may be selectively coupled to the memory cell 150 via program line 116. The magnetoresistive element 300 loses or gains electrical resistance when an external magnetic field is applied to it, and can be provided by a material or structure that exhibits giant magnetoresistance (GMR), colossal magnetoresistance (CMR), anisotropic magnetoresistance (AMR), or magnetic tunnel effect (TMR). Using a magnetic tunnelling junction (MTJ) as an example, an MTJ can include layers 302-312 shown in FIG. 3 and further described with reference to FIG. 4 below.

Exemplary MRAM memory cell 150 provides reference transistor 124 having a gate node coupled to a bit line (BL) 122, a source node coupled to either a predetermined voltage VDD or a signal ground VSS at 115 (depending on the transistor type used), and a drain node coupled to the bottom electrode (312 in FIG. 3) of the magnetoresistive element 300. The top electrode (302 in FIG. 3) of the magnetoresistive element 300 is coupled to a word line (WL) 120. The program line 116 may extend in the vicinity of the magnetoresistive element 300 for write operations. Alternatively, or in addition, a current may be provided to a write line (not shown) to perform a write operation to the magnetoresistive element 300. The MRAM array 100 may further include a column selector 140 and a row selector 142. The column and row selectors 140, 142 are used for addressing cells of the MRAM array 100. For this purpose, the column selector 140 controls the voltage level of the BL 122 and the row selector controls the voltage level of the WL 120.

The sense circuit 180 can detect the logic state of the memory cell 150 based on a comparison of the current on the program line 116 to high and low reference currents received from the reference cells 132. Thus, the read operation is as follows. A memory cell 150 is selected by row selector 142 driving a word line 120 to VDD, and by column selector 140 driving bit line 122 to VDD, while all other rows and columns are grounded. The information in a selected memory cell may be read by comparing its resistance with resistance of reference memory cells 132. For example, reference cells 132 may provide a first magnetoresistive element programmed with logic-low data and a second magnetoresistive element programmed with logic-high data. In this manner, the resistances of a selected magnetoresistive element may be compared differentially with reference logic-high and logic-low magnetoresistive elements. Such a comparison may be performed by supplying a read current (or voltage) to a selected memory cell 150 and detecting the resistance state of the selected memory cell 150.

In the above exemplary embodiment, a logic-low reference cell permanently stores logic-low data, therefore it has a resistance representative of logic-low data. Similarly, a logic-high reference cell permanently stores logic-high data, thus it has a resistance representative of logic-high data. In other embodiments, a fixed voltage (or current) representing the logic-low state, and another fixed voltage (or current) representing the logic-high state can be supplied to the sense circuit 180 for use as reference voltages (or currents).

The increased read margin is particularly advantageous for embodiments that include reference cells 132. In such embodiments, a read operation depends on the ability of the sense circuit 180 to accurately determine a logic state based on whether the voltage from the memory cell 150 is higher or lower than the reference voltage received from the reference cells 132. However, in a large array of memory cells 150, slight differences between MR elements 104 can result in variations among the read voltages received from different memory cells 150. If the read margin is too low, as in prior devices, such deviations in read voltages can result in false readings. On the other hand, by increasing the read margin according to the present disclosure, the impact of differences among the magnetoresistive elements 300 is greatly reduced if not eliminated. As a result, a more reliable memory device can be realized.

During a write operation, electrical current flows through program line 116 and a current is passed through WL 120. The magnitude of these currents is selected such that, ideally, the resulting magnetic fields are not strong enough to affect the memory state of other proximate MR elements in the array, yet the combination of the two magnetic fields (at magnetoresistive element 300) is sufficient for switching the memory state (e.g., switching the magnetic moment of the free layer 304 shown in FIG. 3). In another embodiment (not shown) a dedicated write line may be used. For example, a write operation may be performed by passing electrical current through a bit write line, that extends in the same direction as program line 116. Bit write line is proximate to the bottom electrode (312 of FIG. 3) and is orthogonal to WL 120.

FIG. 3 shows an example of a typical magnetoresistive element 300. The magnetoresistive element 300 includes the following layers: a top electrode layer 302, a ferromagnetic free layer 304, a spacer 306 which serves as a tunneling barrier, a ferromagnetic pinned layer 308, an antiferromagnetic pinning layer 310, and a bottom electrode 312. The ferromagnetic free layer 304 and the ferromagnetic pinned layer 308 are constructed of ferromagnetic material, for example cobalt-iron or nickel-cobalt-iron. The antiferromagnetic pinning layer 310 is constructed of antiferromagnetic material, for example platinum manganese. Magnetostatic coupling between the ferromagnetic pinned layer 308 and the antiferromagnetic pinning layer 310 causes the ferromagnetic pinned layer 308 to have a fixed magnetic moment. The ferromagnetic free layer 304, on the other hand, has a magnetic moment that, by application of a magnetic field, can be switched between a first orientation, which is parallel to the magnetic moment of the ferromagnetic pinned layer 308, and a second orientation, which is antiparallel to the magnetic moment of the ferromagnetic pinned layer 308.

The spacer 306 interposes the ferromagnetic pinned layer 308 and the ferromagnetic free layer 304. The spacer 306 is composed of insulating material, for example aluminum oxide, magnesium oxide, or tantalum oxide. The spacer 306 is formed thin enough to allow the transfer (tunneling) of spin-aligned electrons when the magnetic moments of the ferromagnetic free layer 304 and the ferromagnetic pinned layer 308 are parallel. On the other hand, when the magnetic moments of the ferromagnetic free layer 304 and the ferromagnetic pinned layer 308 are antiparallel, the probability of electrons tunneling through the spacer 306 is reduced. This phenomenon is commonly referred to as spin-dependent tunneling (SDT).

Figure 4:
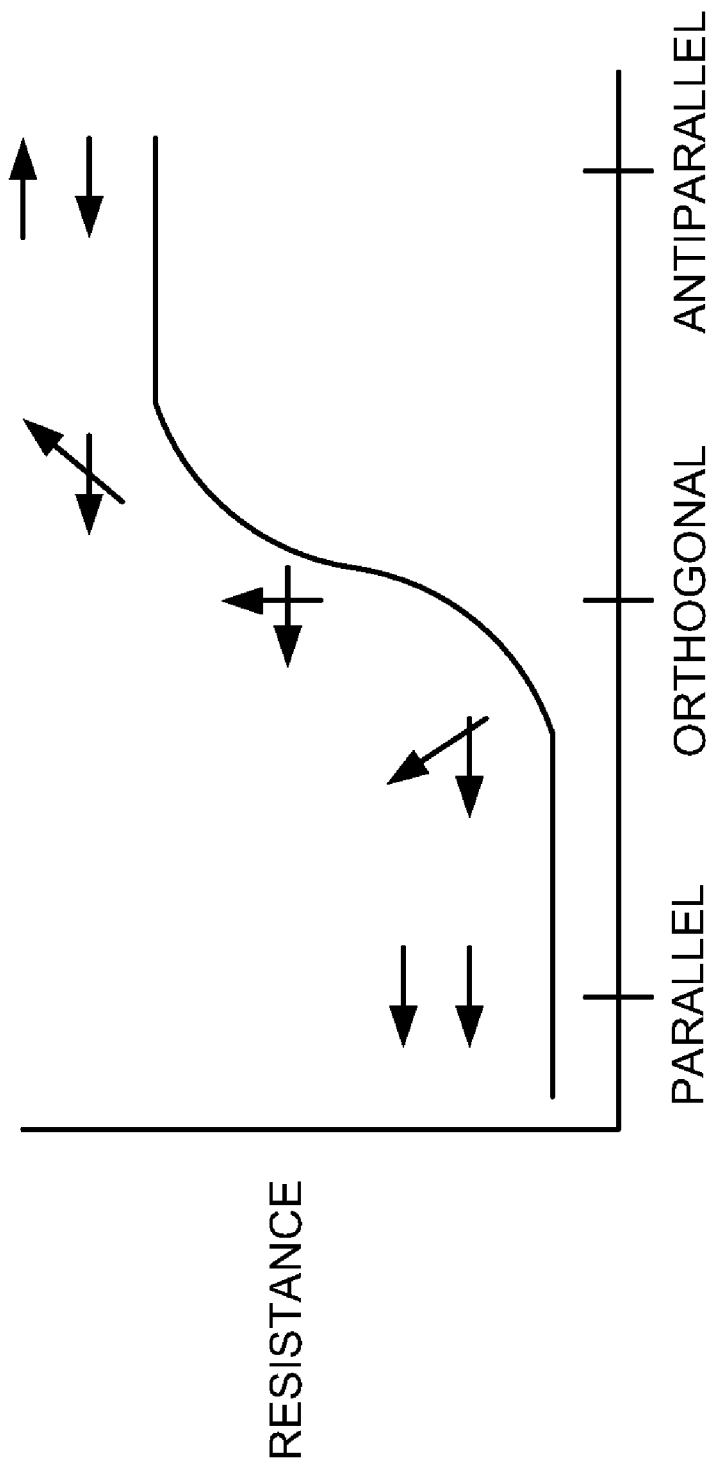
FIG. 4 shows a graph of the relationship between resistance and the relative magnetic orientations of the free and pinned layers in the MTJ shown in FIG. 3.

As shown in FIG. 4, the electrical resistance through the magnetoresistive element 300 (e.g., through layers 302-312) increases as the moments of the pinned and free layers become more antiparallel, and decreases as they become more parallel. In an MRAM memory cell, the electrical resistance of the magnetoresistive element 300 can therefore be switched between first and second resistance values representing first and second logic states. For example, a high resistance value (antiparallel) can represent a logic state "1" and a low resistance value (parallel) can represent a logic state "0". The logic states thus stored in the memory cells can be read by passing a sense current through the MR element and sensing the resistance.

Figure 5:
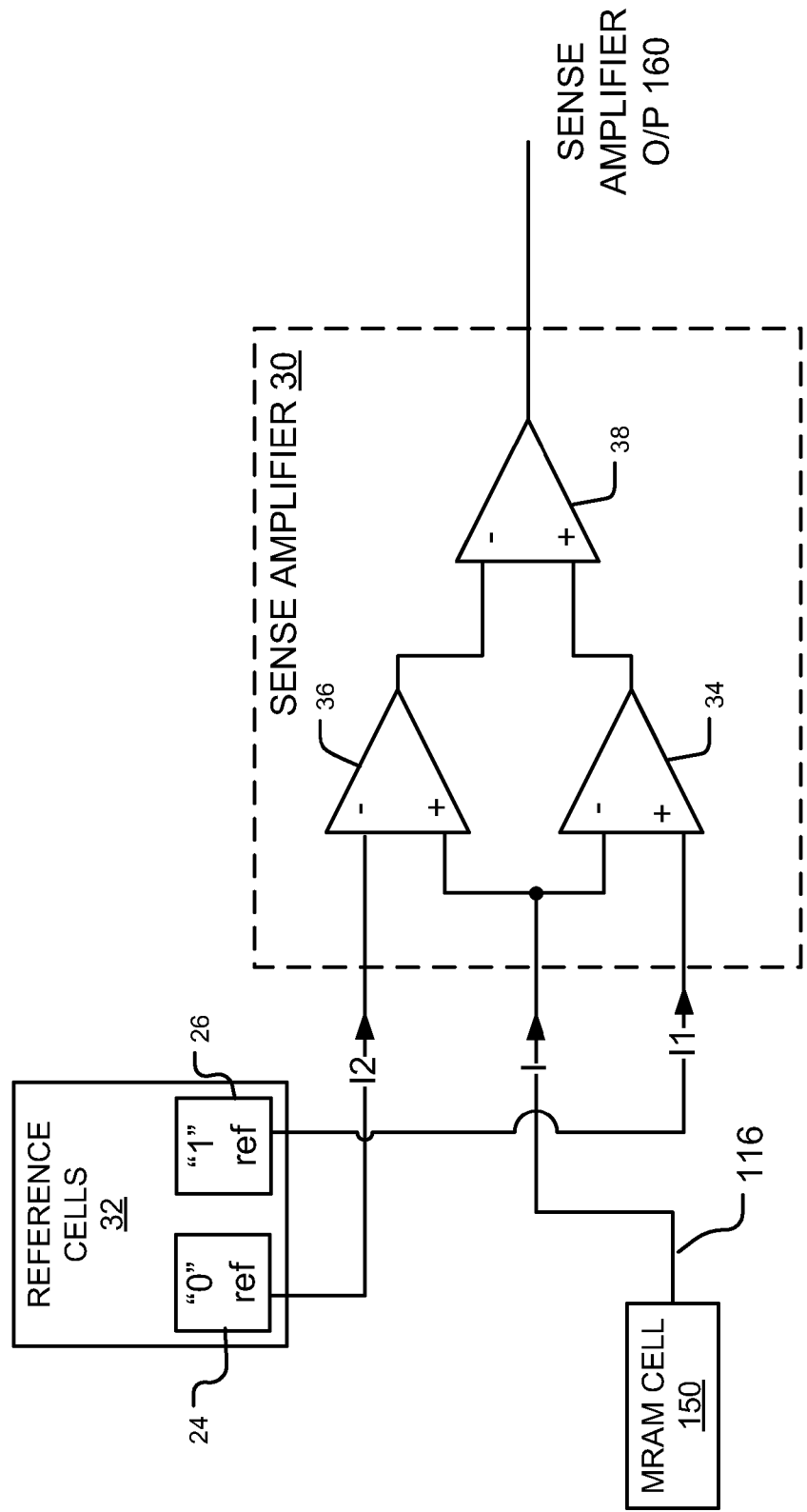
FIG. 5 shows a schematic diagram of a sense amplifier circuit coupled to an MRAM memory cell and reference cells that does not incorporate the teachings of the present disclosure.

As mentioned above, there are multiple options for read schemes for the portion 100 of the MRAM array shown in FIG. 1. One such read scheme is provided with reference to FIG. 5, which shows a sense amplifier 30, as disclosed in commonly-owned application by Jhon Jhy Liaw, entitled "Multiple Stage Method and System for Sensing Outputs from Memory Cells," Ser. No. 11/150,014, which is incorporated by reference.

Sense amplifier 30 includes a first and second differential amplifier 34 and 36, with the respective outputs being input into a third differential amplifier 38. High and low reference cells 24 and 26 respectively provide a high reference cell in high resistance state and a low reference cell in low resistance state. High and low reference cells 24 and 26 have the same structural proportions (e.g., MTJ area) as the MRAM cell 150. Thus, applying a predetermined voltage to cells 24 and 26 causes a first reference current (I1) to be provided from high reference cell 24, and a second reference current (I2) to be provided from low reference cell 26.

Generally, for a read operation, a voltage supply applies a predefined voltage to MRAM cell 150 to generate an output current (I) reflecting a resistance of the memory cell. The predefined voltage is also applied to the reference cells 34 and 36 to generate a first reference current I1 reflecting the high resistance state, and a second reference current I2 reflecting a low resistance state. First differential amplifier 34 provides a first differential value representing the difference between the first reference current and the output current i.e., I1−I. Second differential amplifier 36 provides a second differential value representing the difference between the output current and the second reference current i.e., I−I2. The third differential amplifier 38 compares the first difference signal with the second difference signal to generate a digital output 160 representing the resistance state of the memory cell 150.

The sense margin, which is defined as the difference between the first differential value (I−I2) and the second differential value (I1−I), equals (I1+I2)−2I. So, the sense margin is provided on the output of the third amplifier 38, which compares the first differential value (I−I2) with the second differential value (I1−I) to generate a third differential value (i.e., I1+I2−2I). This sense margin provides a digital output 160 representing the value of the stored bit of MRAM cell 150. Accordingly, when the MRAM cell 150 is in a high resistance state, the value of the output current I is about I1 (i.e., I≈I1). Thus, when the MRAM cell 150 is programmed with a '1', the third differential value provides a sense margin of I2−I1. Conversely, when the MRAM cell 150 is in a low resistance state, the value of the output current is about I2 (i.e., I≈I2). So, when MRAM cell 150 is programmed with a '0', the third differential value provides a sense margin of I1−I2. It is noteworthy that the sensing margin of a conventional sense amplifier circuit of Jeong provides a sense margin of (I1−I2)/2.

Figure 6:
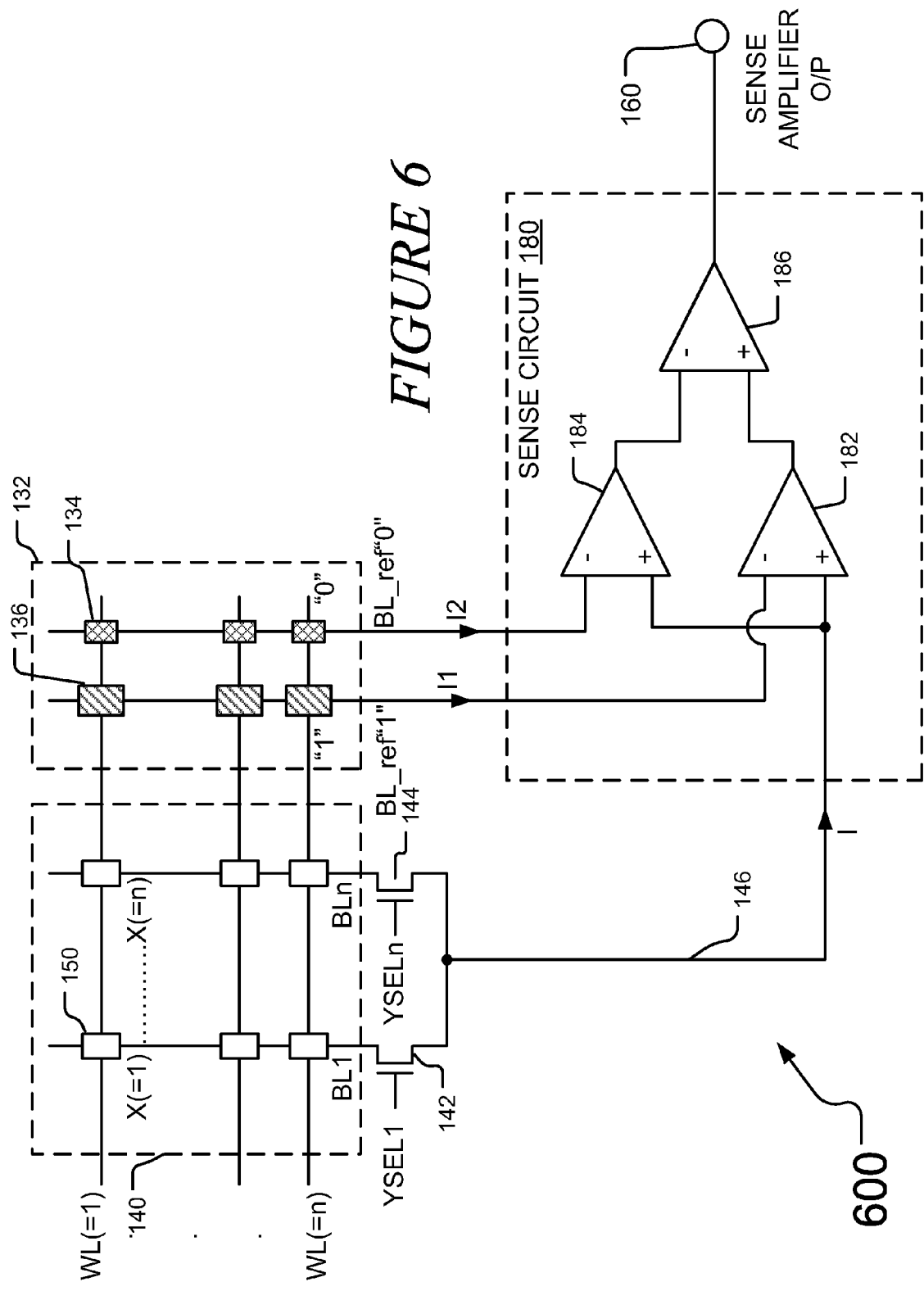
FIG. 6 shows a schematic diagram of an embodiment of a sense amplifier circuit with an improved sense margin in accordance with the present disclosure.

FIG. 6 illustrates circuitry 600 in accordance with a first embodiment. A sense circuit 180 is coupled to memory array 140 that has a plurality of MRAM cells and reference array 132 that has a plurality of reference MRAM cells. The rows of the MRAM cells in memory array 140 are defined by the word lines WL1 . . . WLn. For each word line WL, reference array 132 includes at least one high reference MRAM cell 136 programmed to "1" (i.e., in high resistance state) and at least one low reference MRAM cell 134 programmed to "0" (i.e., in low resistance state). The columns of the MRAM cells in the memory array 140 are defined by the bit lines BL1 . . . BLn. The column of a predetermined MRAM cell in the memory array 140 can be selected with a selection signal on one of the Y-select lines, YSEL1 . . . YSELN, which control select devices, such as NMOS devices 142 and 144.

In this first embodiment, the high reference MRAM cells (e.g., 136) in reference array 132 have a smaller MTJ area than the MRAM cells (e.g., 150) in memory array 140, resulting in cell 136 having a first margin of difference of 1~6 sigma greater resistance than MRAM cell 150. Consistent with this embodiment, the low reference MRAM cells (e.g., 134) have a larger MTJ area than MRAM cells 150, resulting in cell 134 having a second margin of difference of 1~6 sigma less resistance than MRAM cell 150. Accordingly, the resistance of low reference MRAM cell 134 in low resistance state is equal to the resistance of the MRAM cell 150 in low resistance state plus 1~6 sigma, and the resistance of high reference MRAM cell 134 in high resistance state is equal to the resistance of the MRAM cell 150 in low resistance state minus 1~6 sigma. Vice versa, in another embodiment, the low reference MRAM cell 134 may have a smaller MTJ area than MTJ cell 150, and the high reference MRAM cell 136 may have a larger MTJ area than MTJ cell 150, which provides an equivalent circuit to the presently-described first embodiment.

When reading an MRAM cell 150 that is programmed to "1," the MRAM cell 150, a high reference MRAM cell 136 and a low reference MRAM cell 134 will be selected. A predetermined voltage is applied to the appropriate bit line (e.g., BL1), to a first reference bit line BL_ref"1" that is coupled to a high reference MRAM cell 136, and to a second reference bit line BL_ref"0" that is coupled to a low reference MRAM cell 134. The circuitry 600 may further include a source follower (not shown in the figure) for clamping the predetermined voltage in a range, for example, between 0.3 and 1.0V. Due to the voltage applied, the selected MRAM cell 150 generates an output current I, the high reference MRAM cell 136 generates a first reference current I1, and the low reference MRAM cell 134 generates a second reference current I2.

In this embodiment, sense circuit 180 includes a first and second differential amplifier 182 and 184, with the outputs being input into a sense amplifier 186. The logic-high input current I1 is connected to the inverting input of first differential amplifier 182, while the logic-low input current I2 is connected to the inverting input of second differential amplifier 184. Program line 146 from MRAM cell 150, which provides current I, is connected to both the non-inverting input of first differential amplifier 182 and to the non-inverting input of second differential amplifier 184. The output of sense amplifier 186 provides the sense amplifier output 160. The third differential amplifier 186 compares the output from the first differential amplifier 182 (i.e, I–I1) with the output from the second differential amplifier 184 (i.e., I–I2); providing a value of I1–I2 on the sense amplifier output 160. When the MRAM cell is programmed with a '1', the output current I is about I1 (i.e., I≈I1); providing a sense amplifier output current of I1–I2. Conversely, when the MRAM cell is programmed with a '0', the output current I is about I2 (i.e., I≈I2); providing a sense amplifier output current of I2–I1.

The storage data in MRAM cell 150 has a resistance stage that is lower than both reference cells (when storage data is "1") or higher than both reference cells (when storage data is "0"). Accordingly, this provides a very stable differential signal from the first stage differential amplifiers 182 and 184. This configuration of amplifiers provides a full-MR ratio sensing scheme and increases the signal differential two fold from the scheme disclosed with reference to FIG. 5. Also, the sense margin provided with this embodiment is up to four times that of the sense margin disclosed by Jeong. Additionally, the exemplary configuration in this embodiment allows self-compensation of the program load line loading effect and minimizes the process fluctuation. Thus, this sensing scheme provides a high speed and high sensing margin MRAM device.

It is noteworthy that the sense circuit 180 may include a current mirror load for converting current signals into voltage signals. The invention can apply to not only MRAM cells, but also other memory cells such as phase-change random access memory (PRAM) cells and ferroelectric random access memory (FRAM) cells.

Figure 7:
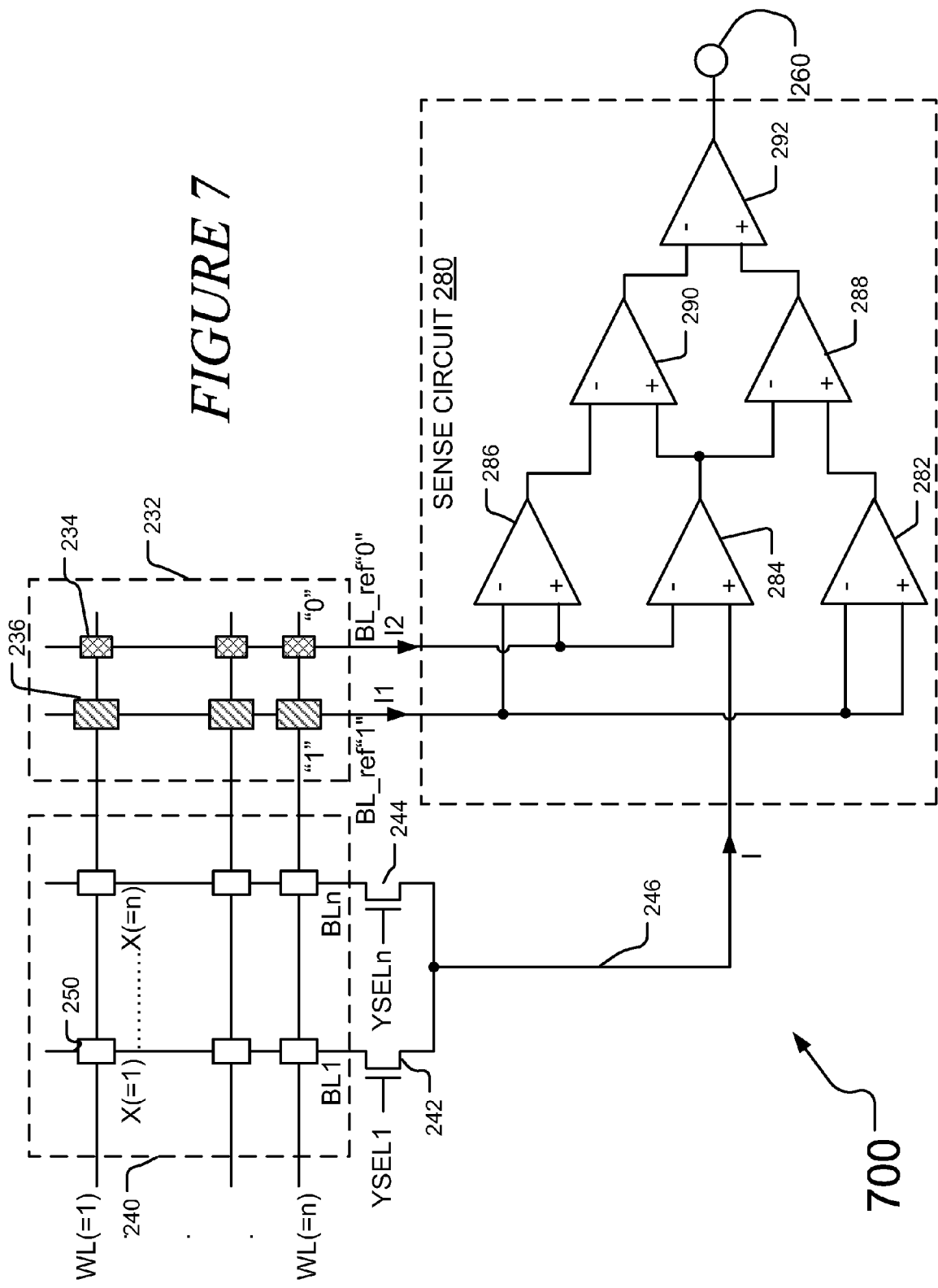
FIG. 7 shows a schematic diagram of another embodiment of a sense amplifier circuit with an improved sense margin in accordance with the present disclosure.

FIG. 7 illustrates circuitry 700 in accordance with a second embodiment. A sense circuit 280 implements a three-stage system where a sense amplifier 292 works with five differential amplifiers 282-290 to provide an increased sense margin. The differential amplifiers 282-286 together form the first stage of amplifiers, while the differential amplifiers 288 and 290 form the second stage of amplifiers, with the sense amplifier 292 forming the third stage. The differential amplifier 284 is coupled to a memory array 240 having a plurality of MRAM cells, and a bit line BL_ref"0," which carries a logic-low reference current from reference array 232. The reference array 232 is similar to the reference array 132 of FIG. 6, in that high-reference MRAM cells (e.g., 236) in reference array 232 have a smaller MTJ area than the MRAM cells (e.g., 250) in memory array 240, and low-reference MRAM cells (e.g., 234) in reference array 232 have a larger MTJ area than the MRAM cells (e.g., 250) in memory array 240, or vice-versa. A row of MRAM cells from the memory array 240 can be selected by a selection signal on the word line WL. A column of a predetermined MRAM cell can be selected with a selection signal from one of the Y-select lines YSEL1 . . . YSELn, which control various select devices, such as NMOS devices 242 and 244. Both input terminals of the differential amplifier 282 are tied to bit line BL_ref"1," which carries the reference current from the column of reference MRAM cells that are programmed to "1."

When reading a data bit from an MRAM cell 250, a voltage supply (not shown in the figure) applies a predetermined voltage to the bit line that is coupled to the MRAM cell 250, a reference bit line BL_ref"1" that is coupled to a high-reference MRAM cell 236 having a high resistance state, and a reference bit line BL_ref"1" coupled to a low-reference MRAM cell 234 having a low resistance state. The differential amplifier 282 outputs a logic "0" signal to the differential amplifier 288. The differential amplifier 284 subtracts the reference current on the reference bit line BL_ref"0" from the output current I from the program line 246. The differential amplifier 286 subtracts the reference current on the reference bit line BL_ref"1" (I1) from the reference current on the reference bit line BL_ref"0" (I2). The differential amplifier 288 of the second stage compares the output of the differential amplifier 282 with the output of the differential amplifier 284, and then outputs a differential value between the output currents of the MRAM cell 250 (I) and the low-reference cell 234 (I2). Meanwhile, the differential amplifier 290 compares the output of the differential amplifier 284 with the output of the differential amplifier 286, and then outputs the differential value between the output current of MRAM cell 250 (I) and the high-reference cell 236 (I1).

The difference between the two differential values equals (I1+I2)−2I, where I1 is the high-reference current from a high-reference MRAM cell (e.g., 236), I2 is the low-reference current from a low-reference MRAM cell (e.g., 234), and I is the output current from an MRAM cell (e.g., cell 250). Because of the difference in cell size, when the MRAM cell 250 is in a low resistance state, the output current I is slightly less than I2 from the low-reference cell 234. The sense margin of the sense circuit 280 is about (I1−I2). This is twice the magnitude of the sense margin (I1−I2)/2 of a conventional sensing circuit. When the MRAM cell 250 is in a high resistance state, the output current I is slightly more than I1 from the high-reference cell 236. The sense margin of the sense circuit 280 becomes I2−I1. This is, again, twice the magnitude of the sensing margin (I1−I2)/2 of a conventional sensing circuit. As such, the sense circuit 280 can better tolerate the output current deviation than the conventional sensing circuit does.

FIG. 8 illustrates circuitry 800 in accordance with a third embodiment. A sense circuit 380 implements a three-stage system where a sense amplifier 392 works with five differential amplifiers 382-390 to provide an increased sense margin. The differential amplifiers 382-386 together form the first stage of amplifiers, while the differential amplifiers 388 and 390 form the second stage of amplifiers, with the sense amplifier 392 forming the third stage. The differential amplifier 384 is coupled to a memory array 340 having a plurality of MRAM cells, and a bit line BL_ref"1," which carries a logic-high reference current from reference array 332. The reference array 332 is similar to the reference array 132 of FIG. 6, in that high-reference MRAM cells (e.g., 336) in reference array 332 may have a smaller MTJ area than the MRAM cells (e.g., 350) in memory array 340, and low-reference MRAM cells (e.g., 334) in reference array 332 may have a larger MTJ area than the MRAM cells (e.g., 350) in memory array 340, or vice-versa. A row of MRAM cells from the memory array 340 can be selected by a selection signal on the word line WL. A column of a predetermined MRAM cell can be selected with a selection signal from one of the Y-select lines YSEL1 . . . YSELn, which control various select devices, such as NMOS devices 342 and 344. Both input terminals of the differential amplifier 382 are tied to bit line BL_ref"0," which carries the logic-low reference current I2 from the column of reference MRAM cells that are programmed to "0."

When reading a data bit from an MRAM cell 350, a voltage supply (not shown in the figure) applies a predetermined voltage to the bit line that is coupled to the MRAM cell 350, a reference bit line BL_ref"1" that is coupled to a high-reference MRAM cell 336 having a high resistance state, and a reference bit line BL_ref"0" coupled to a low-reference MRAM cell 334 having a low resistance state. The differential amplifier 382 outputs a logic "0" signal to the differential amplifier 388. The differential amplifier 384 subtracts the reference current on the reference bit line BL_ref"1" from the output current I from the program line 346. The differential amplifier 386 subtracts the reference current on the reference bit line BL_ref"1" (I1) from the reference current on the reference bit line BL_ref"0" (I2). The differential amplifier 388 of the second stage compares the output of the differential amplifier 382 with the output of the differential amplifier 384, and then outputs a differential value between the output currents of the MRAM cell 350 (I) and the high-reference cell 336 (I1). Meanwhile, the differential amplifier 390 compares the output of the differential amplifier 384 with the output of the differential amplifier 386, and then outputs the differential value between the output current (I) of MRAM cell 350 and the low-reference current (I2) from low-reference cell 334.

The difference between the two differential values equals (I1+I2)−2I, where I1 is the high-reference current from a high-reference MRAM cell (e.g., 336), I2 is the low-reference current from a low-reference MRAM cell (e.g., 334), and I is the output current from an MRAM cell (e.g., cell 350). Because of the difference in cell size, when the MRAM cell 350 is in a low resistance state, the output current I is slightly less than I2 from the low-reference cell 334. The sense margin of the sene circuit 380 is about (I1−I2). This is twice the magnitude of the sense margin (I1−I2)/2 of a conventional sensing circuit. When the MRAM cell 350 is in a high resistance state, the output current I is slightly more than I1 from the high-reference cell 336. The sense margin of the sense circuit 380 becomes I2−I1. This is, again, twice the magnitude of the sensing margin (I1−I2)/2 of a conventional sensing circuit. As such, the sense circuit 380 can better tolerate the output current deviation than the conventional sensing circuit does.

This disclosure provides methods and circuits for sensing MRAM cells with full magneto-resistive ratio by implementing at least two stages of amplifiers for the sensing circuits. Two reference MRAM cells, one programmed high and the other programmed low, are used to compare against a selected MRAM cell throughout several stages of amplifiers, thereby increasing the sense margin when MRAM cells are read. The reference MRAM cells differ in size from the selected MRAM cells, in that the logic high reference cell may be larger and the logic low reference cell may be smaller than the selected MRAM cell, or vice versa. Bit line loading effect can also be self-compensated, while process fluctuation is minimized.

While various embodiments in accordance with the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

As used in this disclosure, the term "signal" means a current and/or a voltage potential. As is understood by a person of ordinary skill in the art, a signal that is represented by a current may equivalently be represented by a voltage potential in an equivalent circuit. Thus, equivalent circuits of sense amplifiers employing current and/or voltage amplifiers may be employed to perform a similar function to the circuits described above.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A circuit for sensing a resistance state of a memory cell, the memory cell being capable of switching between a high resistance state and a low resistance state, comprising:
   a high reference cell in high resistance state;
   a low reference cell in low resistance state;
   a voltage supply for applying a predetermined voltage to the memory cell to generate an output current;
   a set of differential amplifiers selectively coupled to the memory cell and the high and low reference cells; and
   a sense amplifier coupled to the differential amplifiers,
   wherein the resistance of the high reference cell in high resistance state has a first margin of difference from the resistance of the memory cell in high resistance state the first margin of difference being determined by difference in area between the memory cell and the high reference cell, and wherein the resistance of the low reference cell in low resistance state has a second margin of difference from the resistance of the memory cell in low resistance state the second margin of difference being determined by difference in area between the memory cell and the low reference cell.

2. The circuit of claim 1, wherein the first margin of difference is defined by the resistance in the high resistance state of the high reference cell being greater than the resistance in the high resistance state of the memory cell, and wherein the second margin of difference is defined by the resistance in the low resistance state of the reference memory cell being less than the resistance in the low resistance state of the memory cell.

3. The circuit of claim 1, wherein the first margin of difference is defined by the resistance in the high resistance state of the high reference cell being less than the resistance in the high resistance state of the memory cell, and wherein the second margin of difference is defined by the resistance in the low resistance state of the reference memory cell being greater than the resistance in the low resistance state of the memory cell.

4. The circuit of claim 1, wherein the set of differential amplifiers comprises:
   a first differential amplifier for subtracting the first reference current from the output current to generate the first differential signal; and
   a second differential amplifier for subtracting the second reference current from the output current to generate the second differential signal.

5. The circuit of claim 1 wherein the set of differential amplifiers comprises:
   a first differential amplifier for receiving the first reference current and outputting a zero output;
   a second differential amplifier for subtracting the second reference current from the output current;
   a third differential amplifier for subtracting the first reference current from the second reference current;
   a fourth differential amplifier coupled to the first and second differential amplifiers for receiving outputs therefrom to generate the first differential signal; and
   a fifth differential amplifier coupled to the second and third differential amplifiers for receiving outputs therefrom to generate the second differential signal.

6. The circuit of claim 1 wherein the set of differential amplifiers comprises:
   a first differential amplifier for receiving the second reference current and outputting a zero output;
   a second differential amplifier for subtracting the first reference current from the output current;
   a third differential amplifier for subtracting the first reference current from the second reference current;
   a fourth differential amplifier coupled to the first and second differential amplifiers for receiving outputs therefrom to generate the first differential signal; and
   a fifth differential amplifier coupled to the second and third differential amplifiers for receiving outputs therefrom to generate the second differential signal.

7. The circuit of claim 1, wherein the memory cell is a magneto-resistive random access memory (MRAM) cell, phase-change random access memory (PRAM) cell, or ferroelectric random access memory (FRAM) cell.

8. The circuit of claim 1, wherein the sense amplifier comprises a current mirror load for converting current signals into a voltage signal.

9. A method for sensing a resistance state of a memory cell having a high resistance state and a low resistance state, comprising:
   receiving an output current reflecting a resistance of the memory cell; receiving a first reference current reflecting the high resistance state in the high reference cell;
   receiving a second reference current reflecting the low resistance state in the low reference cell;
   generating a first difference signal representing the difference between the output current and the first reference current;
   generating a second difference signal representing the difference between the output current and the second reference current; and
   comparing the first difference signal with the second difference signal;
   and generating a digital output based on the comparison representing the resistance state of the memory cell,
   wherein the resistance of the high reference cell in high resistance state has a first margin of difference from the resistance of the memory cell in high resistance state, and wherein the resistance of the low reference cell in low resistance state the first margin of difference being determined by difference in area between the memory cell and the high reference cell, has a second margin of difference from the resistance memory of the memory cell in low resistance state the second margin of difference being determined by difference in area between the memory cell and the low reference cell.

10. The method according to claim 9, wherein the first margin of difference is defined by the resistance in the high resistance state of the high reference cell being greater than the resistance in the high resistance state of the memory cell, and wherein the second margin of difference is defined by the resistance in the low resistance state of the reference memory cell being less than the resistance in the low resistance state of the memory cell.

11. The method according to claim 9 wherein the first margin of difference is defined by the resistance in the high resistance state of the high reference cell being less than the resistance in the high resistance state of the memory cell, and wherein the second margin of difference is defined by the resistance in the low resistance state of the reference memory cell being greater than the resistance in the low resistance state of the memory cell.

12. The method according to claim 9, further comprising:
   applying a predetermined voltage to the memory cell to generate the output current, to a high reference cell to generate the first reference current, and to a low reference cell to generate the second reference current.

13. The method according to claim 12, further comprising selecting the memory cell, the high reference cell, and the low reference cell, before the step of applying the predetermined voltage.

14. The method according to claim 9:
wherein the step of generating the first difference signal further comprises:
inputting the output current into a first node of a first differential amplifier,
inputting the first reference current into a second node of the first differential amplifier, and
outputting the first difference signal from the first differential amplifier by subtracting the first reference current from the output current; and
wherein the step of generating the second difference signal further comprises:
inputting the output current into a first node of a second differential amplifier,
inputting the second reference current into a second node of the second differential amplifier, and
outputting the second difference signal from the second differential amplifier by subtracting the second reference current from the output current.

15. The method according to claim 9, wherein the steps of generating the first and second difference signals further comprises:
inputting the first reference current into a first node and a second node of a first differential amplifier;
inputting the output current into a first node of a second differential amplifier, and the second reference current into a second node of the second differential amplifier; and
inputting the second reference current into a first node of a third differential amplifier, and the first reference current into a second node of the third differential amplifier;
subtracting an output of the second differential amplifier from an output of the first differential amplifier with a fourth differential amplifier to generate the first difference signal; and
subtracting an output of the third differential amplifier from an output of the second differential amplifier with a fifth differential amplifier to generate the second difference signal.

16. The method according to claim 9, wherein the step of generating the first and second difference signals further comprises:
inputting the second reference current into a first node and a second node of a first differential amplifier;
inputting the output current into a first node of a second differential amplifier, and the first reference current into a second node of the second differential amplifier; and
inputting the second reference current into a first node of a third differential amplifier, and the first reference current into a second node of the third differential amplifier;
subtracting an output of the second differential amplifier from an output of the first differential amplifier with a fourth differential amplifier to generate the first difference signal; and
subtracting an output of the third differential amplifier from an output of the second differential amplifier with a fifth differential amplifier to generate the second difference signal.

17. The method according to claim 9, wherein the comparing further comprises:
inputting the first difference signal into a first node of a sense amplifier;
inputting the second difference signal into a second node of the sense amplifier; and
outputting the digital output from the sense amplifier based on comparison between the first and second difference signals.

18. A circuit for sensing a resistance state of a memory cell coupled to a bit line and a word line, the memory cell being capable of switching between a high resistance state and a low resistance state, the circuit comprising:
a high reference cell in high resistance state, selectively coupled to the word line and a high reference bit line;
a low reference cell in low resistance state, selectively coupled to the word line and a low reference bit line, wherein the memory cell, the high reference cell and the low reference cell are selected by a selection signal on the word line;
a voltage supply for applying a predetermined voltage to the bit line, the high reference bit line and the second reference bit line to generate an output current reflecting a resistance of the memory cell, a high reference current reflecting the high resistance state of the high reference cell, and a second reference current reflecting the low resistance state of the low reference cell;
a set of differential amplifiers selectively coupled to the memory cell and the high and low reference cells; and
a sense amplifier coupled to the differential amplifiers,
wherein the resistance of the high reference cell in high resistance state has a first margin of difference from the resistance of the memory cell in high resistance state the first margin of difference being determined by difference in area between the memory cell and the high reference cell, and wherein the resistance of the low reference cell in low resistance state has a second margin of difference from the resistance memory of the memory cell in low resistance state the second margin of difference being determined by difference in area between the memory cell and the low reference cell.

19. The circuit of claim 18, wherein the set of differential amplifiers comprises:
a first differential amplifier for subtracting the first reference current from the output current to generate the first differential signal; and
a second differential amplifier for subtracting the second reference current from the output current to generate the second differential signal.

20. The circuit of claim 18, wherein the sense amplifier comprises a current mirror load for converting current signals into a voltage signal.

* * * * *